United States Patent [19]

Konishi et al.

[11] 4,300,238
[45] Nov. 10, 1981

[54] CONTROL ASSEMBLY FOR ELECTRONIC TUNING RECEIVERS

[75] Inventors: Hideo Konishi; Kazunori Matsuoka; Takao Gouya, all of Higashihiroshima, Japan

[73] Assignee: Sharp Kabushiki Kaisha, Osaka, Japan

[21] Appl. No.: 124,744

[22] Filed: Feb. 26, 1980

[30] Foreign Application Priority Data

Feb. 26, 1979 [JP] Japan .............................. 54-22403

[51] Int. Cl.³ .............................................. H03J 7/30
[52] U.S. Cl. .................................. 455/161; 455/177; 455/165; 74/10.27
[58] Field of Search ............... 455/161, 162, 168, 169, 455/170, 176, 177, 160, 165; 74/10 R, 10.27, 10.22; 334/18, 40

[56] References Cited

U.S. PATENT DOCUMENTS

| | | | |
|---|---|---|---|
| 2,589,331 | 3/1952 | Broos | 455/160 |
| 2,958,771 | 11/1960 | Mural et al. | 455/170 |
| 3,177,432 | 4/1965 | Kelln | 455/177 |

*Primary Examiner*—Jin F. Ng
*Attorney, Agent, or Firm*—Birch, Stewart, Kolasch & Birch

[57] ABSTRACT

A digital oscillator is provided which has digital oscillation outputs corresponding to the sweep speed of the local oscillation frequency of a local oscillator included in an electronic tuning radio receiver. An oscillation frequency controlling element which forms an external oscillation frequency control section of the digital oscillator and a circuit constant variable upon variations in its working length, is mounted on an operator operable knob shaft on the operational panel of the radio receiver around the rotation path of a sweep speed controlling element mounted coaxially thereto. The sweep speed controlling element and the oscillation frequency controlling element are connected to an input section of the digital oscillator. There is further provided a Distance/LOCAL receiver mode selecting element coaxially on the knob shaft.

4 Claims, 3 Drawing Figures

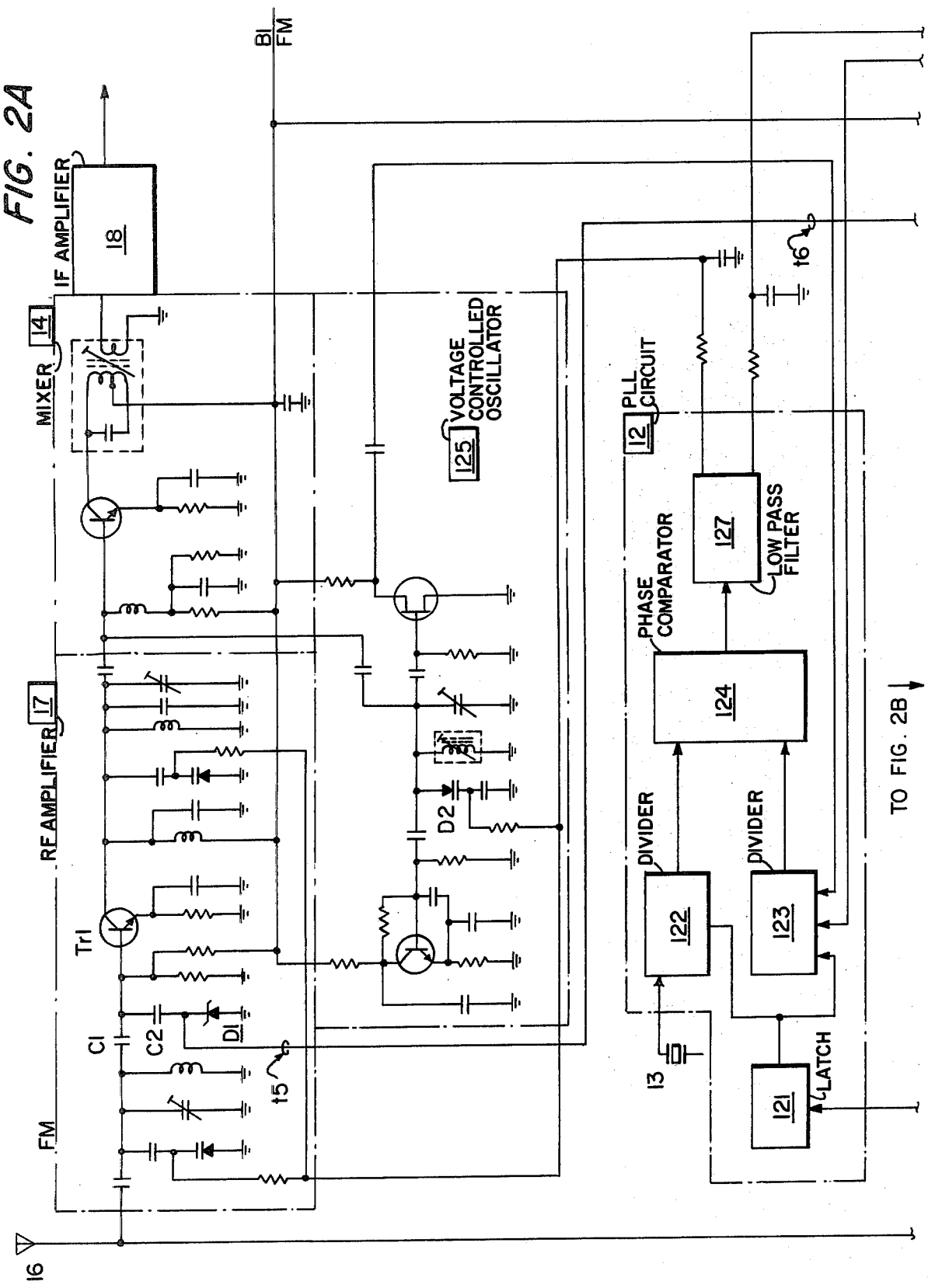

CONTROL ASSEMBLY FOR ELECTRONIC TUNING RECEIVERS

BACKGROUND OF THE INVENTION

This invention relates to an electronic tuning receiver and more particularly to an electronic tuning receiver in which the rate of sweeping the local oscillation frequency of a local oscillator is controlled in association with alternative selection of Distance mode reception or LOCAL mode reception.

In the conventional electronic tuning receiver, a sweep rate control knob and a Distance receiver/LOCAL receiver mode selector switch are individually installed on a receiver operational panel so that it is impossible to select from the Distance and LOCAL receiver modes by the movement of the sweep speed control knob. In other words, after the Distance/LOCAL receiver mode selector switch is turned to the Distance receiver mode side, for example, sweep operation is initiated at a maximum rotation position of the sweep speed control knob and thus at a high speed upon the rotation of the sweep speed control knob. The operator's careful attention must be paid to listen to broadcasting signals with the resulting difficulty in the tuning operation during the Distance (weak intensity and long distance) receiver mode in which the broadcasting signals are substantially small and weak.

On the other hand, the broadcasting signals are relatively strong and thus the tuning operation relatively easy even during the high speed sweep operation of the LOCAL (strong wave and short distance) receiver mode. However, a slow sweep operation prolongs the period of time required for completing the tuning operation. While it is desirable to install a Distance/LOCAL receiver mode selector responsive to the sweep speed on the receiver panel, this is impossible as a matter of fact. However, provided that the broadcasting signals are equal in level during both the DX receiver mode and the LOCAL receiver mode, the actuation of only the mode selector can achieve the optimum tuning operation.

For car radio receivers in which the location thereof constantly varies with respect to respective broadcasting stations, it is technically difficult to equal the broadcasting signal level during the tuning operation for both the Distance receiver mode and the LOCAL receiver mode. The sweeping speed therefore must vary in accordance with whichever one of the Distance mode or the LOCAL mode is active, in order to achieve prompt and accurate tuning operation.

Moreover, there are various requirements for the installation of car radio receivers on an instrument mount panel in front of the driver's seat, the radio receivers being limited in shape and size depending upon different types and makes of vehicles. The sweep speed control knob and the Distance/LOCAL mode selector should be mounted in relation with other operating switches and knobs. An increase in the number of switches and knobs on radio receivers mounted in these vehicles is undesirable to safe driving.

OBJECTS OF THE INVENTION

It is therefore an object of the present invention to provide an improved electronic tuning radio receiver which can provide various controls concerning the speed and direction of sweeping the local oscillation frequency as well as selection of the Distance receiver mode and the LOCAL receiver mode upon the actuation of only one knob. One of significant features of the present invention is that it increases an effective area in a front panel of radio receivers such as car radio receivers to allow addition of other functional attracting features.

BRIEF DESCRIPTION OF THE DRAWINGS

For a more complete understanding of the present invention and for further objects and advantages thereof, reference is now made to the following description taken in conjunction with the accompanying drawings, in which.

DETAILED DESCRIPTION OF PREFERRED EMBODIMENTS

Figure 1:
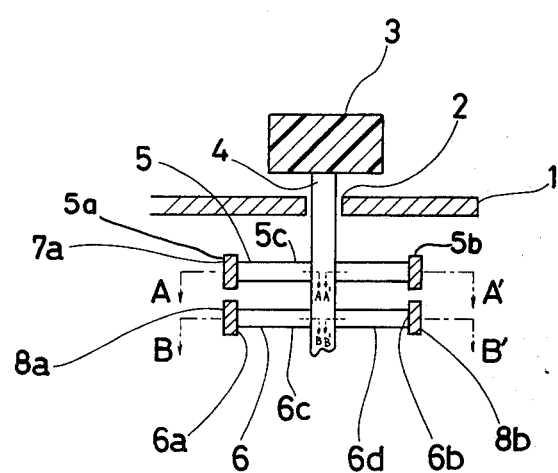
FIG. 1 is a cross sectional view of a selector knob constructed in accordance with the present invention.

Referring now to FIG. 1, there is illustrated a schematic cross sectional side view of a receiver constructed in accordance with the present invention, which includes a front panel 1. An upper surface of the front panel 1 serves as an operator operable operational panel and inside assembly of the receiver is located below the front panel 1. The front panel 1 is provided with an insertion hole 2 in which a shaft 4 of an externally operable knob 3 travels for controlling the speed of sweeping the local oscillation frequency in association with selection of the Distance and LOCAL modes. The lowest end of the shaft 4 is loosely supported in place in the interior of the radio receiver, although not shown. This knob has the functions of controlling the direction of the sweep operation and selecting the Distance and LOCAL modes in addition to the above mentioned control. Movable terminals 5 and 6 are disposed in parallel with each other on the shaft 4 along the longitudinal direction of the shaft 4. One of the movable terminals 5 is used to control the speed and direction of the sweep operation of the local oscillation frequency, whereas the other movable terminal 6 is used to select the Distance and LOCAL receiver modes according to the AM or FM channel selected to receive. Sweep direction and speed controlling elements 7a and 7b are installed along rotation paths of the both ends 5a and 5b of the movable terminal 5, whereas Distance/LOCAL mode selecting elements 8a (8a₁ and 8a₂) and 8b (8b₁ and 8b₂) are installed along rotation paths of the both ends 6a and 6b of the remaining movable terminal 6. The rotation of the respective terminals describes a semicircular path. Those controlling elements are held in place within the radio receiver.

Figure 2B:
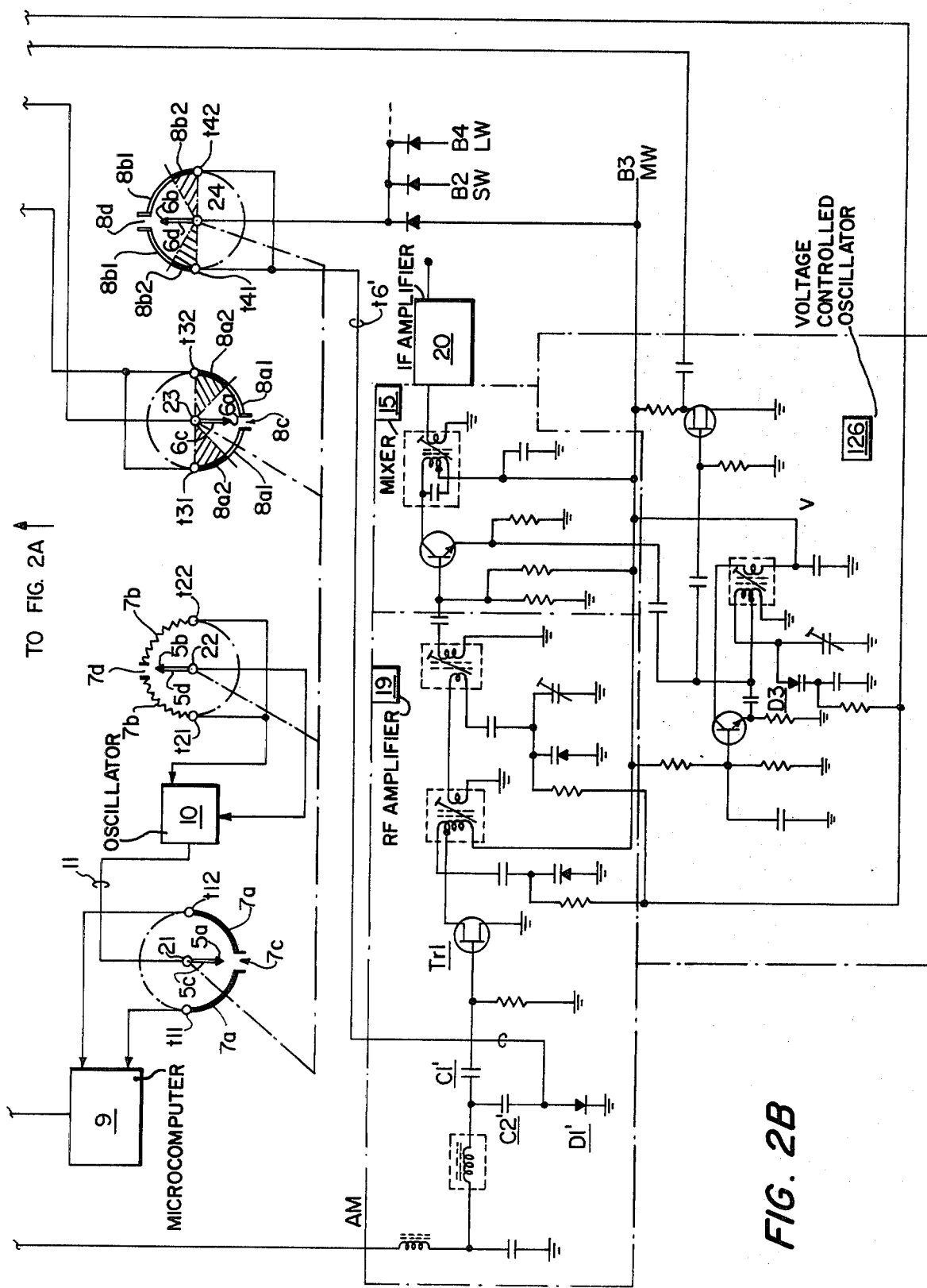
FIG. 2 is a circuit diagram of a radio receiver embodying the present invention.

FIG. 2 is a schematic circuit representation of the radio receiver according to the present invention, wherein 21 through 24 show each quarter of the knob shaft in plan view taken along the lines A—A, A′—A′, B—B and B′—B′ of FIG. 1.

The one end 5a of a half segment 5c of the movable terminal 5 movable in union with the split shaft 21 rotates clockwise and counterclockwise within an angular range of 90° with respect to a neutral position 7c (a filler or a vacant cavity) between the sweep direction controlling elements 7a and 7a which may be made of a good electrical conductor such as silver and copper. Similarly, the one end 5b of the other segment 5d of the movable terminal 5 movable in union with the split shaft 22 can rotate clockwise and counterclockwise within an angular range of 90° with respect to a neutral position $7d$ between sweep speed controlling elements $7b$ and $7b$ which are surrounded by an electrically resistive coating such as carbon.

The end $6a$ of one arm $6c$ of the terminal 6 movable in union with the split shaft 23 rotates clockwise and counterclockwise within a range of 90° with respect to a neutral position $8c$ between two Distance/LOCAL mode selecting elements $8a_1$ and $8a_2$, the Distance mode controlling element $8a_1$ being rotatable clockwise and counterclockwise within a range of 60° and the LOCAL mode controlling element $8a_2$ having the remaining rotation range. The Distance mode controlling element $8a_1$ comprises electrically insulating material and the LOCAL mode controlling element $8a_2$ comprises good electrical conductor such as silver or copper.

The movable terminal $6c$ operatively associated with the split shaft 23 becomes operative while in the FM receiver mode. The end $6b$ of the other arm $6d$ of the movable terminal 6 on the split shaft 24 is rotatable clockwise and counterclockwise within a range of 90° with respect to a neutral position $8d$ which is sandwiched by the Distance mode controlling elements $8b_1$ of insulating material with a rotatable range of 60° and the LOCAL mode controlling elements $8b_2$ of electrically good conductor such as silver and copper with the remaining rotation angle.

The movable terminal $6d$ on the split shaft 24 is operative under the AM (LW, MW and SW) receiving condition. It is appreciated that the rotatable ranges and locations of those DX mode controlling elements $8a_1$ and $8b_1$ and those LOCAL mode controlling elements $8a_2$ and $8b_2$ are freely selectable depending upon the sweep direction and speed.

Both terminals $t_{11}$ and $t_{12}$ of the sweep direction controlling elements $7a$ are connected to an UP data input terminal and a DOWN data input terminal of a microcomputer 9. Both terminals $t_{21}$ and $t_{22}$ of the sweep speed controlling elements $7b$ are commonly connected to one frequency control input of an oscillator 10, while the fixed end of the movable terminal $5d$ on the split shaft 22 is connected to another input of the oscillator 10. The output of the oscillator 10 is connected via a line 11 to the fixed end of the movable terminal $5c$ on the split shaft 21. As the split shaft 22 rotates the length of the controlling element $7b$ varies between the end $5b$ of the movable terminal $5d$ and a sliding contact of the controlling element $7b$, thus varying the value of resistance with respect to the input to the oscillator 10. In this manner the oscillation frequency output of the oscillator 10 is externally controlled by varying the length of the controlling element $7b$.

The oscillator 10 has digital oscillation frequency outputs (1 Hz to 20 Hz), the pulse interval of these outputs corresponding to the spacing between two adjacent allotted broadcasting frequencies. The higher the frequency of the oscillator 10 the higher the sweep speed.

The reason why the oscillator 10 is designed to oscillate within a range of 1 Hz to 20 Hz is to avoid the situation where the sweep speed becomes too high for the operator to tune and look for his desired broadcasting signals. When the split shaft 22 is rotated clockwise with respect to the neutral position $7d$, the end $5a$ of the movable terminal $5c$ on the split shaft 21 moves in contact with the controlling element $7a$ having the terminal portion $t_{11}$, indicating the microcomputer 9 through data inputs applied thereto that the sweep operation is to start with a lowest frequency and end with a highest one. If the split shaft 22 is rotated in the opposite direction, then the microcomputer 9 accepts the opposite date inputs.

It will be understood that the microcomputer 9 responds to the oscillation frequency of the oscillator 10 applied as the data inputs thereto and executes data processing on the sweep speed. The microcomputer 9 may be replaced by an UP/DOWN counter as will be discussed later.

As stated above, the movable terminal $6c$ in union with the split shaft 23 is used while the receiver is receiving any FM broadcasting signals. The stational end of the movable terminal $6c$ is coupled with a positive DC power supply voltage $+B_1$. The common junction $t_6$ of terminals $t_{31}$ and $t_{32}$ of the LOCAL mode controlling elements $8a_2$ leads to an input terminal $t_5$ of an RF amplifier 17 as discussed hereinafter. The base electrode of an amplifying transistor $Tr_1$ within the RF amplifier 17 is connected to each of one plate of capacitors $C_1$ and $C_2$, the other plate of the capacitor $C_2$ being connected to a cathode of a Zener diode $D_1$ of which the anode is grounded.

An input terminal $t_5$ at the junction of the diode $D_1$ and the capacitor $C_2$ is supplied with the DC power supply voltage $+B_1$ so that the diode $D_1$ becomes conductive to lower the base voltage of the amplifying $Tr_1$ and thus reduce its gain by approximately 20 dB. Assume now that the movable terminal $6c$ is turned clockwise away from the neutral position $8c$. While the end $6a$ moves in contact with the Distance mode controlling element $8a_1$, the supply voltage $+B_1$ is not developed at the common junction $t_6$ due to the insulating characteristics of that element $8a_1$. The result is that no DC voltage is supplied to the cathode of the Zener diode $D_1$ via the input terminal $t_5$ and the amplifying transistor $Tr_1$ performs amplification with a maximum gain to enable the Distance receiver mode.

If the movable terminal $6c$ moves clockwise away from the neutral position $8c$ and goes beyond the rotatable range of 60°, its end $6a$ slides on the LOCAL mode controlling element $8a_2$ of electrically conductive material, permitting the DC supply voltage $+B_1$ to be applied to the cathode of the diode $D_1$ through the common junction $t_6$ and the input terminal $t_5$. As a result of this, the diode $D_1$ is conductive to lower the base bias voltage of the amplifying transistor $Tr_1$ and thus its gain, thus enabling the LOCAL receiver mode. This is true when the movable terminal $6c$ is rotated counterclockwise about the neutral position.

The movable terminal is of use when the receiver is in the AM (LW, MW and SW) reception mode. DC power supply voltages $+B_2$, $+B_3$ and $+B_4$ are applied to the stationary end of the movable terminal $6d$ via a check diode. Terminals $t_{41}$ and $t_{42}$ of the LOCAL mode controlling elements $8b_2$ are commonly connected, the common junction $t_6'$ leading to an input terminal $t_5'$ of an AM receiving RF amplifier 19. Depending upon the angular position and direction of the movable terminal $6d$, an amplifying transistor $Tr_1'$ is controlled in gain by a combination of capacitors $C_1'$ and $C_2'$ and a Zener diode $D_1'$, thus enabling the Distance and LOCAL receiver modes as in the FM reception.

When the end $5b$ of the movable terminal $5d$ faces against the neutral position $7d$, the respective movable terminals 5c, 6c and 6d also face against their neutral positions 7c, 8c and 8d. Upon clockwise rotation of the movable terminal 5d the sweep speed increases with an increase in its angular position as far as the angular position is within a range of 0° to 60° (the oscillation frequency of the oscillator 10 is 1 Hz to 10 Hz). Since on the other hand the end of the movable terminal 6c or 6d is in contact with the Distance mode controlling element, the amplifying transistor $Tr_1$ or $Tr_1'$ performs amplification with a maximum gain. If the angular position goes beyond 60°, the sweep speed further increases (the oscillation frequency of the oscillator 10 is within 10 HZ to 20 HZ). Under these circumstances the end of the movable terminal 6c or 6d is in contact with the LOCAL mode controlling element so that the amplifying transistor $Tr_1$ or $Tr_1'$ suffers from a gain drop of approximately 20 dB in the amplifying performances. The sweep operation is oriented from a lowest frequency to a highest one because the respective movable terminals are rotated clockwise. A mode selector switch not shown decides whether the FM receiver mode or the AM receiver mode is operative. Once any of the modes has been selected the functions of other circuit elements associated with the non-selected mode are disabled. It is also possible for the Distance/LOCAL mode selector switch to serve as the AM/FM mode selector, in which case only one of the movable terminals 6c and 6d is needed.

The output of the microcomputer 9 which receives the digital outputs from the oscillator 10 is introduced into a latch circuit 121 within a PLL (phase locked loop) circuit 12 as denoted by the broken line, the output of the PLL circuit 12 being supplied to respective dividers 122 and 123. The divider 122 divides the frequency of a crystal standard oscillator 13 by the contents of the latch circuit 121 and the output of the standard oscillator is supplied to one input of a phase comparator 124. The divider 123, on the other hand, divides selectively the outputs of voltage-controlled oscillators 125 and 126 under control of the output of the latch circuit 121. The output of the divider 123 is supplied to another input of the phase comparator 124. The phase comparator 124 compares in phase its two inputs and supplies its resulting output to a low pass filter 127 of which the output is supplied back to the voltage-controlled oscillators 125 and 126. These voltage-controlled oscillators 125 and 126 have each a voltage-controlled variable capacitance element $D_2$ and $D_3$ (shown as being located outside the circuits 125 and 126 for the purpose of illustration only) whose capacitance is variable according to an applied voltage to its cathode to control the oscillation outputs of the oscillators 125 and 126 which form local oscillators within the radio receiver. The respective outputs of the oscillators are supplied to an FM mixer 14 and an AM mixer 15, respectively. If it is desirable to receive FM broadcasting signals via an antenna, then the FM/AM mode selector is turned to the FM side such that the received FM frequency is applied to a high frequency amplifier 17. The intermediate frequency corresponding to the frequency output of the local oscillator 125 is available from the mixer 14. This intermediate frequency output is amplified by way of an intermediate frequency amplifier 18. In the drawings, an AM receiving high frequency amplifier is labeled 19 and an AM receiving intermediate frequency amplifier is labeled 20. FM broadcasting signals range from 76 MHz to 90 MHz with each station allotted every 100 KHz with an intermediate frequency of 10.7 MHz in Japan. Each of FM stations in Europe is allotted every 50 KHz within a range of 87.50 to 108.10 MHz.

It is also evident that MW broadcasting stations are allotted every 9 KHz within a frequency range of 531–1,602 KHz with its intermediate frequency being defined as 455 KHz in Japan. LW stations extend between 155 to 281 KHz in Europe.

Although the speed and direction of sweeping the local oscillation frequency are governed by the output of the microcomputer 9 responsive to the actuation of the knob 1 by way of the latch circuit 121, selection of the Distance and LOCAL modes is accomplished by the actuation of the knob 1 at the same time.

Whereas the present invention has been described with respect to specific embodiments thereof, it will be understood that various changes and modifications will be suggested to one skilled in the art, and it is intended to encompass such changes and modifications as fall within the scope of the appended claims.

We claim:

1. An electronic tuning receiver including a swept frequency local oscillator, the improvement comprising: an operator operable element for controlling the sweep speed of the local oscillation frequency and for selecting DISTANCE and LOCAL receiver modes at the same time upon the actuation thereof.

2. An electronic tuning receiver as set forth in claim 1 further comprising: means for adjusting the gain of an amplifier included within said receiver upon the actuation of said operator operable element.

3. An electronic tuning receiver as set forth in claim 1 wherein said local oscillator is a voltage-controlled oscillator within a PLL (phase locked loop) circuit.

4. An electronic tuning receiver as set forth in claim 1 wherein said operator operable element comprises a first movable member for controlling the sweep speed and a second movable member for selecting the DISTANCE and LOCAL receiver modes, and first and second movable members being arranged coaxially on a same shaft.

* * * * *